United States Patent [19]

Miyamoto

[11] 4,052,674
[45] Oct. 4, 1977

[54] VHF TUNER DEVICE

[75] Inventor: Kunito Miyamoto, Kitano, Japan

[73] Assignee: Matsushita Electric Industrial Co., Ltd., Japan

[21] Appl. No.: 270,841

[22] Filed: July 11, 1972

[51] Int. Cl.² ............................................ H04B 1/18
[52] U.S. Cl. .................................. 325/374; 325/378; 325/454
[58] Field of Search ............... 325/373, 376, 383, 384, 325/387, 378, 454, 458, 459, 462, 374; 334/47, 56, 65

[56] References Cited

U.S. PATENT DOCUMENTS

| | | | |
|---|---|---|---|
| 2,798,955 | 7/1957 | Balash | 325/459 X |
| 3,036,212 | 5/1962 | Meyer et al. | 325/459 |
| 3,328,701 | 6/1967 | Rieth | 325/459 |
| 3,333,202 | 7/1967 | Valdettaro | 325/459 |

*Primary Examiner*—Benedict V. Safourek
*Attorney, Agent, or Firm*—Burgess, Ryan and Wayne

[57] ABSTRACT

An input device for a tuner utilizing as an amplifier element a bipolar transistor or tetrode metal-oxide-semiconductor field-effect transistor is provided in which an impedance means is connected in parallel with an impedance of an antenna; a capacitor means is inserted between the input terminal of the amplifier element and a group of tuning coils or inductance means for selecting the television channels in the high frequency band when a channel in the high frequency band is selected whereas an inductance means is inserted between the input terminal and a group of tuning coils for selecting the channels in the low frequency band when a channel in the low frequency band is selected; and an impedance means is inserted between the input terminal of the amplifier element and the earth. The tuning frequency band widths or selectivities in both the high and low frequency bands may be made substantially equal without causing the loss due to the impedance mismatching even when the input impedance of the amplifier element varies greatly in response to the change in frequency.

3 Claims, 7 Drawing Figures

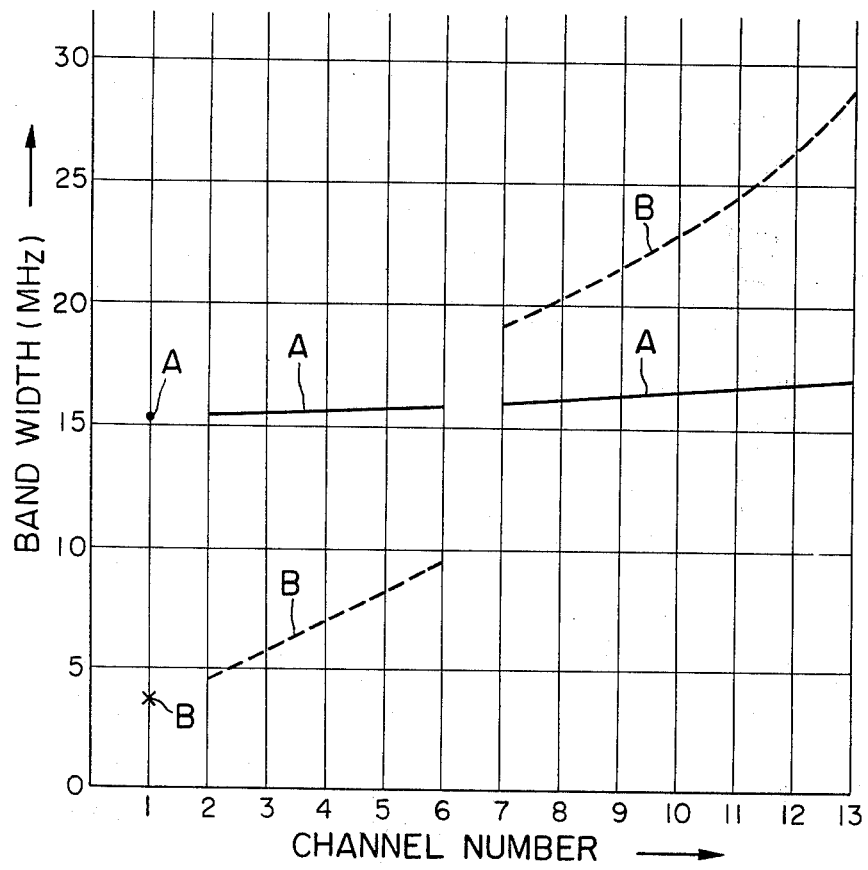

VHF TUNER DEVICE

BACKGROUND OF THE INVENTION

The present invention relates to an input device utilizing a transistor for a tuner.

In the input device for a tuner utilizing a tetrode metal-oxide-semiconductor field-effect transistor (to be referred to as "tetrode MOSFET" hereinafter for brevity), the input impedance of the MOSFET may be expressed in terms of a resistor and a capacitor connected in parallel. When the frequency increases, the input capacitance increases only a little whereas the input resistance decreases very remarkably so that the tuning frequency band widths or selectivities are widely different in the high and low frequency bands when the impedance matching between an antenna and the MOSFET is established. Especially in the low frequency band, the tuning band width or selectivity becomes very narrow or very sharp so that the special adjustment is required. This is not preferable from the standpoint of assembly and electrical characteristics.

SUMMARY OF THE INVENTION

One of the objects of the present invention is to provide an input device for a tuner which is capable of making equal or uniform the tuning band widths or selectivities in the high and low frequency bands of television channels without causing the loss due to the impedance mismatching in case of the great variation in frequency dependence characteristic of the input impedance of an amplifier element.

Another object of the present invention is to provide a tuner device which may be assembled in a simple manner and has the excellent electrical characteristics.

Briefly stated, according to the present invention, an impedance means is connected in parallel with the impedance on the side of an antenna; a capacitor means is inserted between the input terminal of an amplifier element and a group of inductance means for tuning in the high frequency band when a channel in the high frequency band is selected whereas an inductance means is inserted between the input terminal and a group of inductance means for tuning in the low frequency band when a channel in the low frequency band is selected; and an impedance means is inserted between the input terminal of the amplifier element and the earth.

The above and other objects, features and advantages of the present invention will become more apparent from the following description of the preferred embodiment thereof taken in conjunction with the accompanying drawing.

BRIEF DESCRIPTION OF THE DRAWING

FIG. 5 is a graph illustrating the tuning band widths or selectivities of the input device of the present invention and of the prior art device for comparison.

DESCRIPTION OF THE PREFERRED EMBODIMENT

Figure 1:
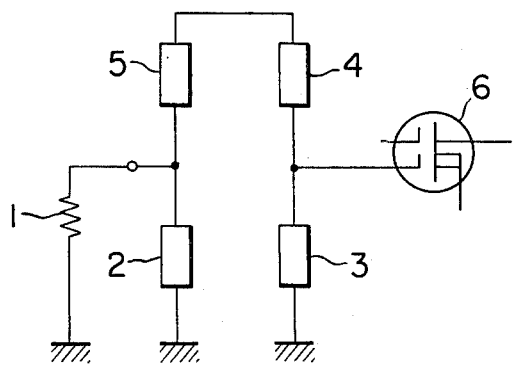
FIG. 1 is a block diagram of a prior art input device utilizing a tetrode MOSFET for tuner.

Referring to FIG. 1, the tuner input device utilizing a MOSFET generally comprises an impedance 1 on the side of an antenna, a tetrode MOSFET 6, and reactances 2, 3, 4, and 5, the reactance 5 being the inductance of the variable tuning coils. Reactances 2, 3 are capacitive reactances.

Figure 2:
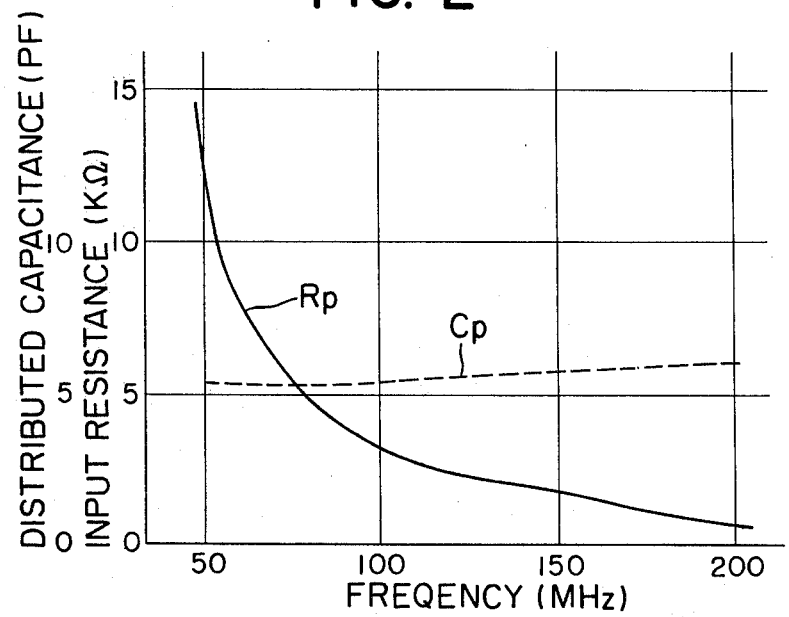
FIG. 2 is a graph illustrating the change in the input impedance of a tetrode MOSFET expressed in terms of a capacitance and a resistance connected in parallel.
Figure 3A:
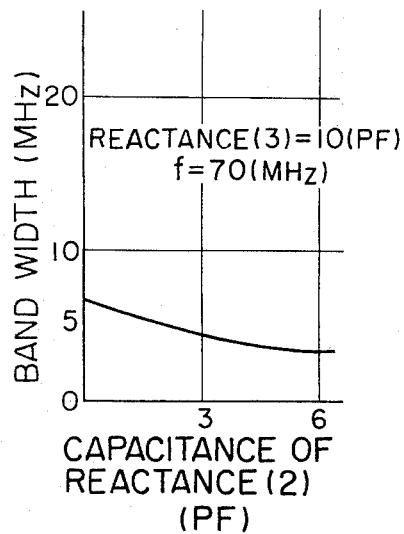
FIG. 3A and 3B are graphs illustrating the tuning bands width or selectivities of the prior art input device for a tuner in the high and low frequency bands respectively.
Figure 3B:
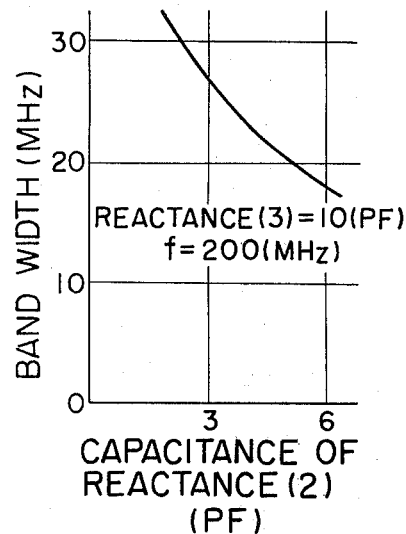

The input impedance of the tetrode MOSFET 6 is expressed in terms of the resistance Rp and capacitance Cp of a parallel circuit and the typical values are shown in the graph in FIG. 2. It is seen that the input resistance Rp is greatly dependent upon the frequency, and is rapidly increased as the frequency becomes lower. As a result, in case of the impedance matching between the antenna and the tetrode MOSFET with the reactance 4 of 10 pico farads, the tuning band widths or the selectivities are widely different in the high frequency band (See FIG. 3b) and the low frequency band (See FIG. 3a). Especially in the low frequency band, the tuning band width is very narrow, that is the selectivity is too high, so that the re-adjustment is required. This is not preferable from the standpoint of the assembly and the electrical characteristics.

The present invention was made to overcome this problem. That is, according to the present invention, the tuning band widths or selectivities in both the high and low frequency bands are made substantially equal while the impedance matching is maintained.

Next referring to FIG. 4, one preferred embodiment of the present invention will be described. A capacitor 8 is inserted between the earth and the signal input terminal of the tetrode MOSFET 7, and a channel or frequency selection contact member 9 is connected to the input signal terminal of the tetrode MOSFET 7. A capacitive reactance 11 corresponding to the reactances 2 of FIG. 1 is connected in parallel with an antenna radiation impedance 10, and the output terminal of the reactance 11 is connected to a contact member 12.

In operation, the contact member 9 on the side of the tetrode MOSFET 7 is made into contact with a conductor 13 for tuning in the high frequency band and with a conductor 14 for tuning in the low frequency band. The high frequency band conductor 13 is grounded through a capacitor 15 so that the capacitance of the tetrode MOSFET 7 may be increased in case of the tuning in the high frequency band.

A second conductor 16 for tuning in the high frequency band and a second conductor 17 for tuning in the low frequency band are disposed in parallel with the first high and low frequency band tuning conductors 13 and 14 respectively, and are coupled thereto through a capacitor 18 and a coil or inductance 19, respectively. As a result, the input element to the tetrode MOSFET 7 may become capacitive in case of the tuning in the high frequency band and inductive in case of the tuning in the low frequency band. Thus, the tuning band widths or selectivities may be substantially made equal in both the high and low frequency bands while the impedance matching may be maintained.

The contact member 12 on the side of the antenna makes contact with one of a plurality of stationary contact members 20a, 20b, 20c and so on and 21a, 21b, 21c, and so on which in turn are coupled to the second tuning conductors 16 and 17 through tuning coils 22a, 22b, 22c, and so on for the high frequency band and tuning coils 23a, 23b, 23c and so on for the low frequency band.

Thus, the capacitance 15 is coupled to the input terminal of the tetrode MOSFET 7 in case of the tuning in the high frequency band whereas the inductance 19 is coupled in case of the tuning in the low frequency band. Therefore, the tuning band widths or selectivities in the high and low frequency bands may be made substantially equal while the impedance matching between the tetrode MOSFET and the antenna may be maintained.

The advantages of the input device in accordance with the present invention are clear from FIG. 5 in which the tuning or selectivity characteristics of the input device of the present invention A and of the prior art input device B are depicted for comparison. It is seen that the tuning band widths or selectivities in both the high and low frequency bands of the input device A of the present invention are substantially equal over the whole frequency range as compared of those of prior art input device B. Thus, according to the present invention, the tuning band widths or selectivities in both the high and low frequency bands may be made substantially equal while the loss due to the input impedance mismatching of the tetrode MOSFET 7 when the frequency changes may be minimized.

Figure 6:
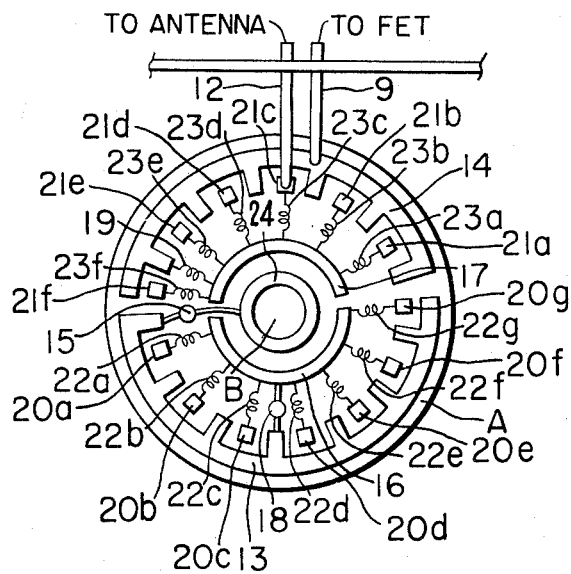
FIG. 6 is a front view of a practical tuner device incorporating the input device shown in FIG. 4.
Figure 4:
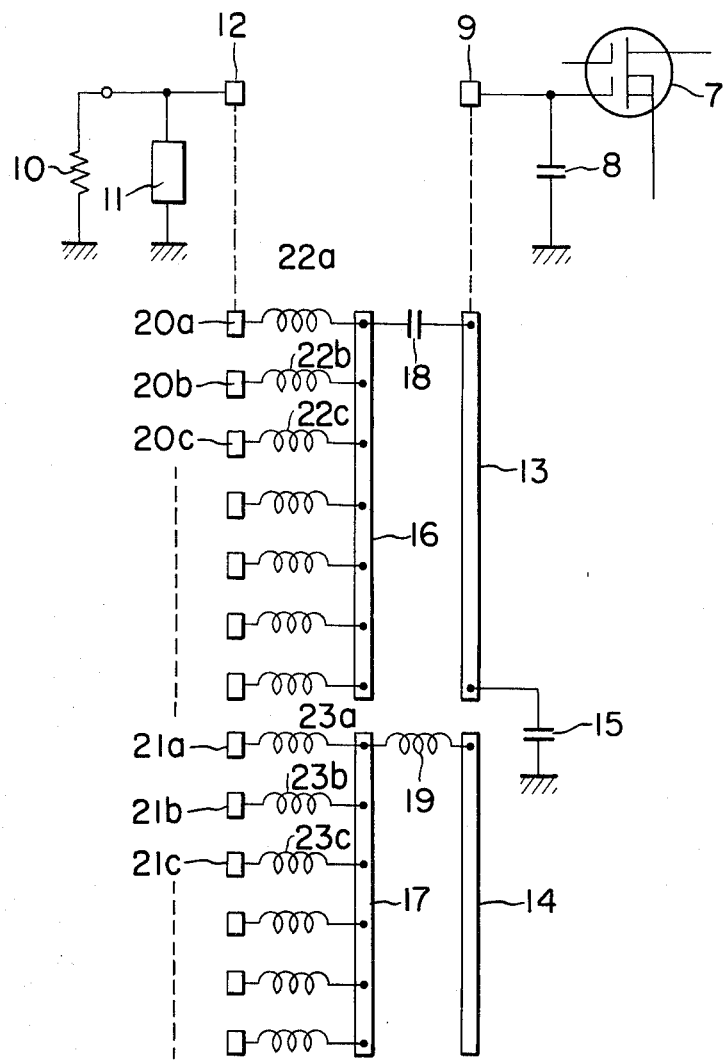
FIG. 4 is a circuit diagram of one preferred embodiment of an input device for a tuner in accordance with the present invention.

FIG. 6 shows the rotary type input device in accordance with the present invention in which the component parts similar to those shown in FIG. 4 are designated by the same reference numerals. A disk A made of an insulating material is securely fixed to a rotary channel selection shaft B. The arcuate conductors 13, 14, 16 and 17 are disposed on the disk A coaxially of the channel selection shaft B, and an annular conductor 24 is electrically coupled to the shaft B. the contact members 20a, 20b, 20c and so on and 21a, 21b, 21c and so on are equiangularly disposed on the disk A coaxially of the shaft B. The contact member 9 is normally made into contact with the first high or low band tuning conductor 13 or 14, whereas the contact member 12 makes contact with one of the stationary contact members 21a, 21b, 21c and so on and 20a, 20b, 20c and so on as the shaft B and hence the disk A are rotated for channel selection. The arrangements of the other component parts are similar to those described hereinbefore with reference to FIG. 4 so that no detailed description will be made.

In the instant embodiment, the tetrode MOSFET is used, but it should be understood that the bipolar transistors may be also used in the present invention.

As described above, according to the present invention, the tuning band widths or selectivities in both the high and low frequency bands of the television channels may be substantially made equal without causing the increase in loss even when the frequency dependent characteristic of the input impedance of the transistor changes very rapidly. The input device in accordance with the present invention is especially adapted for use with the tetrode MOSFET.

What is claimed is:

1. In a tuner device having an input circuit comprised of capacitive reactance means in parallel with an antenna radiation impedance, an antenna circuit having an amplifier with an input electrode, and capacitive means between said electrode and a point of reference potential, and frequency selecting means connected between said input circuit and said amplifier circuit; the improvement wherein said frequency selecting means comprises first and second groups of inductors, means selectively connecting said input circuit to an end of each of said inductors, capacitor means having one terminal connected to the other ends of said inductors of the group of inductors corresponding to the higher tuning frequencies, inductor means having one terminal connected to the other ends of the inductors of the group of inductors corresponding to the lower tuning frequencies, means selectively connecting the other terminals of said capacitor means and inductor means to said electrode, and a capacitor connected between the other terminal of said capacitor means and a point of reference potential.

2. The tuner device of claim 1 wherein said amplifier device comprises a MOSFET.

3. The tuner device of claim 1 comprising an insulating disk secured to a selecting shaft in a plane at right angles thereto, said means for selectively connecting the other terminals of said capacitor means comprising first and second arcuate conductors mounted on said disk at a first radius thereof and at different angular displacements, a first contact member positioned to selectively contact said arcuate conductors and coupled to said electrode, third and fourth arcuate conductors mounted on said disk and angularly aligned with said first and second arcuate conductors respectively at a second radius on said disk, said means for selectively connecting said input circuit comprising a plurality of contacts equi-angularly mounted on said disk at a third radius and a second contact member positioned to selectively contact said contacts, the inductors of said first group of inductors being connected between said third arcuate conductor and separate said contacts of a first group of said contacts, the inductors of said second group of inductors being connected between said fourth arcuate conductor and separate contacts of a second group of said contacts, said inductor means being connected between said first and third arcuate conductors, said capacitor means being connected between said second and fourth arcuate conductors, and said capacitor being connected between said second arcuate conductor and said shaft.

* * * * *

UNITED STATES PATENT OFFICE
CERTIFICATE OF CORRECTION

Patent No. 4,052,674     Dated October 4, 1977

Inventor(s) Kunito Miyamoto

It is certified that error appears in the above-identified patent and that said Letters Patent are hereby corrected as shown below:

The term of this patent subsequent to September 4, 1991 has been disclaimed.

*Signed and Sealed this*

*Seventeenth* Day of *January 1978*

[SEAL]

*Attest:*

RUTH C. MASON
*Attesting Officer*

LUTRELLE F. PARKER
*Acting Commissioner of Patents and Trademarks*